US012633885B2

(12) United States Patent (10) Patent No.: US 12,633,885 B2
Lesso et al. (45) Date of Patent: May 19, 2026

(54) SWITCHING DRIVERS WITH VOLTAGE MONITORING

(71) Applicant: Cirrus Logic International Semiconductor Ltd., Edinburgh (GB)

(72) Inventors: John P. Lesso, Edinburgh (GB); Douglas J.W. Macfarlane, Edinburgh (GB); John L. Melanson, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 380 days.

(21) Appl. No.: 18/224,770

(22) Filed: Jul. 21, 2023

(65) Prior Publication Data

US 2025/0030387 A1     Jan. 23, 2025

(51) Int. Cl.
H03F 3/217     (2006.01)
H03M 1/12     (2006.01)
H04R 1/00     (2006.01)

(52) U.S. Cl.
CPC ............ H03F 3/2175 (2013.01); H03M 1/12 (2013.01); H04R 1/005 (2013.01); *H03F 2200/351* (2013.01)

(58) Field of Classification Search
CPC .. H03F 3/2175; H03F 2200/351; H03M 1/12; H04R 1/005
USPC .......................................................... 330/10
See application file for complete search history.

(56) References Cited

U.S. PATENT DOCUMENTS

| | | | | | |
|---|---|---|---|---|---|
| 4,951,052 | A | * | 8/1990 | Jacob | H04B 14/062 341/122 |
| 7,224,217 | B2 | | 5/2007 | Hida et al. | |

| | | | | | |
|---|---|---|---|---|---|
| 7,800,437 | B2 | * | 9/2010 | Khoury | H03F 3/2173 330/10 |
| 8,705,773 | B2 | * | 4/2014 | Lee | H03F 3/181 381/120 |
| 2005/0212592 | A1 | * | 9/2005 | Hida | H03F 1/308 330/10 |
| 2007/0247223 | A1 | * | 10/2007 | Morishima | H03F 3/38 330/10 |
| 2011/0064245 | A1 | | 3/2011 | Kim et al. | |
| 2011/0095836 | A1 | * | 4/2011 | Putzeys | H03K 7/08 332/109 |

(Continued)

OTHER PUBLICATIONS

Combined Search and Examination Report under Sections 17 and 18(3), UKIPO, Application No. GB2406971.8, mailed Oct. 29, 2024.

*Primary Examiner* — Hafizur Rahman
(74) *Attorney, Agent, or Firm* — Jackson Walker L.L.P.

(57) ABSTRACT

This application relates to methods and apparatus for switching drivers. The switching driver has first and second switches for selectively connecting an output node to first and second switching voltages respectively to generate a first output voltage. A compensator is configured to receive a first monitor signal indicative of a sum of the first and second switching voltages and a second monitor signal indicative of a difference between the first and second switching voltages and to apply compensation to the input signal based on the first and second monitor signals so as to compensate for variations in the first and second switching voltages from defined nominal values of the first and second switching voltages. A modulator controls a duty cycle of the first and second switches based on the input signal after said compensation has been applied.

17 Claims, 2 Drawing Sheets

(56)                    References Cited

U.S. PATENT DOCUMENTS

| | | | |
|---|---|---|---|
| 2013/0321190 A1* | 12/2013 | Lesso | H03M 1/186 |
| | | | 341/158 |
| 2015/0288335 A1* | 10/2015 | Høyerby | H03F 1/0205 |
| | | | 330/251 |
| 2019/0081621 A1* | 3/2019 | Schinkel | H03M 1/1245 |
| 2023/0058434 A1* | 2/2023 | Yang | H03F 3/183 |

* cited by examiner

SWITCHING DRIVERS WITH VOLTAGE MONITORING

FIELD OF DISCLOSURE

The field of representative embodiments of this disclosure relates to methods, apparatus and/or implementations concerning or relating to switching driver or amplifier circuits that may be used to drive a transducer, and in particular to switching driver circuits with voltage monitoring of the switching voltages.

BACKGROUND

Many electronic devices include transducer driver circuitry for driving a transducer with a suitable driving signal, for instance for driving an audio output transducer of the host device or a connected accessory, with an audio drive signal. In some applications, the driver circuitry may include a switching driver, e.g. a class-D amplifier output stage or the like, for generating the output drive signal. Switching drivers, sometimes referred to as switched-mode drivers or switched-mode amplifiers, can be relatively power efficient. A switching driver generally operates to switch an output node between different switching voltages, with a duty cycle that provides a desired average output voltage, over the course of one or more switching cycles, for the output drive signal.

One factor that can affect performance of such a switching driver, in particular for low level output signals, is variation of the switching voltages, e.g. noise affecting the switching voltages. Generally, therefore, it may be desirable to mitigate for noise affecting the switching voltages.

Embodiments of the present disclosure relate to methods and apparatus for switching drivers which provide monitoring of the switching voltages, in particular for monitoring of the switching voltages for variations in an efficient manner that allows for compensation to be applied.

SUMMARY

According to an aspect of the disclosure there is provided a switching driver for driving a load with an output drive signal based on an input signal. The switching driver comprises first and second switches, for selectively connecting a first output node to first and second switching voltages respectively, to generate a first output voltage at said output node. A compensator is configured to receive a first monitor signal indicative of a sum of the first and second switching voltages and a second monitor signal indicative of a difference between the first and second switching voltages and to apply compensation to the input signal based on the first and second monitor signals, so as to compensate for variations in the first and second switching voltages from defined nominal values of the first and second switching voltages. A modulator is configured to control a duty cycle of the first and second switches based on the input signal after the compensation has been applied.

In some examples, the defined nominal values of the first and second switching voltages are equal and opposite. In some examples, in one mode of operation, the defined nominal value of the first switching voltage is non-zero and positive and the defined nominal value of the first switching voltage is ground.

In some examples, the switching driver may comprise a first analog-to-digital converter configured to receive a voltage which is a sum of the first and second switching voltages and to output said first monitor signal, and a second analog-to-digital converter configured to receive a voltage which is a difference of the first and second switching voltages and to output said second monitor signal. The first analog-to-digital converter may have a dynamic range which is lower than the second analog-to-digital converter. The first analog-to-digital converter may be optimized for smaller input signals than the second analog-to-digital converter. The switching driver may also comprise first and second filters, configured to apply low-pass filtering to the first and second monitor signals respectively.

The compensator may be configured to apply compensation to the input signal by generating a modified input signal based on the input signal, the first monitor signal and the second monitor signal and the modulator may be configured to control the duty cycle of the first and second switches based on the modified input signal. The compensator may be configured to generate the modified input signal based on the first and second monitor signals, such that the first output voltage corresponds to an output voltage that would be expected for the input signal without modification, if the first and second switching voltages had values equal to the defined nominal values of the first and second switching voltages. The compensator may be configured to generate the modified input signal based on the function (2*Vnom*Sin−VCM)/VDIFF where Sin is the input signal Vnom is the nominal defined magnitude of the first and second switching voltages, VCM is the value of the first signal and VDIFF is the value of the second signal.

The modulator may comprise a forward signal path and a feedback path forming a control loop and, in some examples, the compensator may be configured to apply compensation to the input signal by applying to a compensation function to at least one of the forward signal path and the feedback path of the modulator.

In some examples, the switching driver of claim may further comprise third and fourth switches, for selectively connecting a second output node to the first and second switching voltages respectively, to generate a second output voltage at the second output node, so as to drive a load connected, in use, between the first and second output nodes with the output drive signal. The modulator may also be configured to control a duty cycle of the third and fourth switches based on the input signal after the compensation has been applied.

The switching driver may be configured as an audio driver for driving an audio output transducer. The switching driver may be implemented as an integrated circuit. Aspects also relate to an electronic device comprising the switching driver of any of the embodiments described herein.

In a further aspect there is provided a switching driver for driving a load based on an input signal comprising an output stage for selectively connecting an output node to first and second switching voltages respectively and a modulator configured to control a duty cycle of the output stage based on the input signal. The modulator comprises a compensator configured to compensate for variations in the first and second voltages based on an indication of a sum of the first and second switching voltages and an indication of a difference between the first and second switching voltages.

In a yet further aspect there is provided switching driver for driving a load with an output drive signal based on an input signal comprising an output bridge stage comprising first and second switches for selectively connecting an output node to first and second switching voltages respectively to generate the output drive signal; a first analog-to-digital converter configured to receive a voltage which is a sum of the first and second switching voltages and to output a first monitor signal; a second analog-to-digital converter configured to receive a voltage which is a difference of the first and second switching voltages and to output a second monitor signal; and a modulator configured to control a duty cycle of the first and second switches based on the input signal, the first monitor signal and the second monitor signal.

It should be noted that, unless expressly indicated to the contrary herein or otherwise clearly incompatible, then any feature described herein may be implemented in combination with any one or more other described features.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Figures 1, 2:
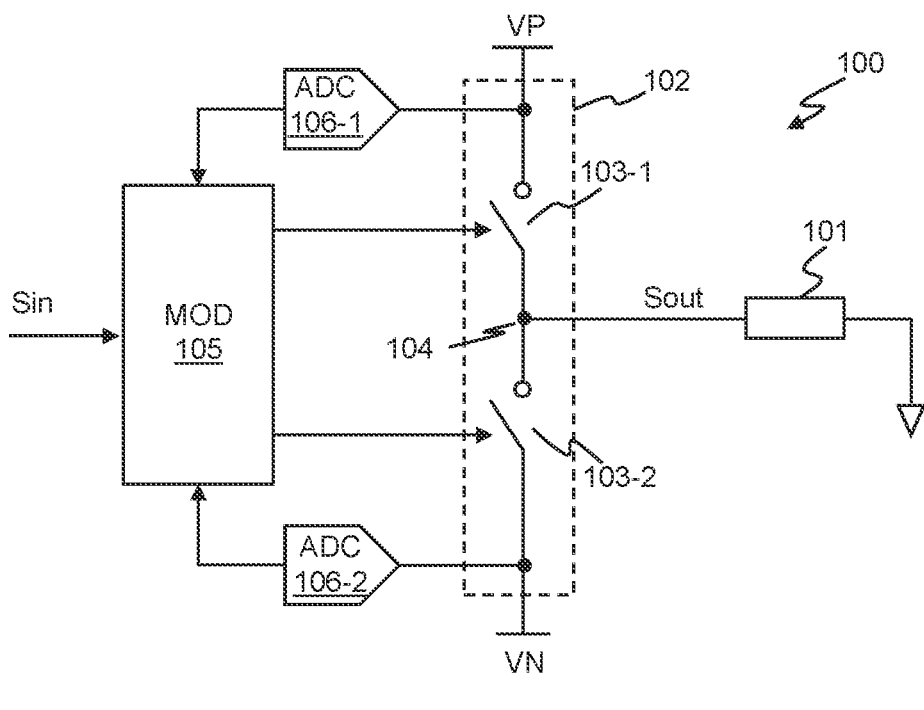
FIG. 1 illustrates generally an example of a switching driver.
FIG. 2 illustrates an example of a switching driver according to an embodiment.

FIG. 1 illustrates an example of a switching driver 100 for driving a load 101 with an output signal Sout based on an input signal Sin. The load 101 may be a transducer, for example an audio output transducer such as a speaker or a haptic output transducer such as a linear resonant actuator, but in general the load could be any sort of load which may be driven with a variable output signal Sout based on an input signal Sin.

The switching driver 100 comprises an output bridge stage 102 which, in this example comprises first and second switches 103-1 and 103-2 for selectively connecting an output node 104 to first or second switching voltages VP and VN respectively. The first and second switches 103-1 and 103-2 may generally be implemented by one or more power transistors, such as MOSFET devices as would be understood by one skilled in the art.

The switching driver 100 also comprises a modulator 105 which is configured to receive the input signal Sin and generate switch control signals for controlling the switching of the first and second switches 103-1 and 103-2 with a controlled duty-cycle. For the example of FIG. 1, the modulator 105, which may, for example, comprise a PWM (pulse-width-modulation) modulator, may control the switching of the first and second switches 103-1 and 103-2 in antiphase (with a short dead-time to prevent current shoot-through) with a controlled duty-cycle.

By controlling the duty-cycle of the first and second switches 103-1 and 103-2, the voltage at the output node 104 can be controlled to have a value, on average over the course of the switching cycle, with a value within a range defined by the switching voltages VP and VN. If the duty-cycle is defined in terms of the proportion of the switching cycle in which the first switch 103-1 is closed with the second switch 103-2 open (with the first switch 103-1 being open and the second switch 103-2 closed for the rest of the switching cycle), then a duty-cycle at or near 100% will result in the voltage at the output node 104 being at or near the voltage VP and a duty-cycle at or near 0% will result in the output node 104 being at or near the voltage VN.

The switching driver 100 of FIG. 1 is configured as a single-ended driver for driving one side of the load with an output signal Sout which varies with the input signal Sin and other side of the load 101 is coupled to a DC voltage that does not vary with the input signal Sin and which may typically correspond to a midpoint voltage which is midway between the voltages VP and VN, but it will be understood that switching drivers may be implemented in a bridge-tied-load (BTL) configuration, where each side of load is driven with an output voltage that varies based on the input signal to generate the desired output drive signal across the load.

For at least some applications, the first and second switching voltages VP and VN may be configured to be equal and opposite to one another (that is of equal magnitude but opposite polarity), i.e. VP=−VN. This can be advantageous in that the midpoint voltage, which may correspond to a quiescent level of output signal, is ground, i.e. zero volts. In this case, the voltage at the output node 104 can be controlled to vary positively and negatively in the range of +VP to −VP and thus the load 101 may be driven with an output signal Sout in this range.

One issue that can affect the performance of a switching driver such as illustrated in FIG. 1 is unwanted variation of the switching voltages VP and/or VN, e.g. noise affecting the switching voltages VP and VN. The output node 104 is connected to the switching voltage VP via first switch 103-1 for a proportion of the switching cycle and then to the switching voltage VN for the rest of the switching cycle. The duty-cycle may be controlled based on the defined nominal values of the switching voltages VP and VN to generate the desired output voltage at the output node 104 based on the input signal. However, if the switching voltages VP and/or VN vary from these nominal values, i.e. are affected by noise, the resulting voltage of the output signal Sout will also vary, which can lead to distortion of the output signal. This may be particularly an issue when the input signal Sin, and hence the output signal Sout, has a relatively low amplitude, as the impact of the noise may be relatively more significant.

It has been proposed that one way to address this issue would be to monitor the individual switching voltages VP and VN and then determine the duty-cycle for the output stage 102 based on the monitored values of the switching voltages VP and VN. FIG. 1 thus illustrates that a first ADC 106-1 could be arranged to monitor and provide a digital indication of the switching voltage VP and a second ADC 106-2 could be arranged to monitor and provide a digital indication of the switching voltage VN. The modulator 105 could then determine an appropriate duty-cycle based on the actual switching voltages VP and VN.

Whilst this approach could provide compensation for variation of the switching voltages away from the nominal values, i.e. for noise, implementing the first and second ADCs 106-1 and 106-2 in an efficient way can be challenging. The first ADC 106-1 monitors the switching voltage VP, which could potentially be of the order of several volts or, in some cases, tens of volts and thus the first ADC 106-1 needs to have a sufficient dynamic range for this level of voltage input. However, the variation in the switching voltage VP, i.e. the noise signal component, may be a relatively small signal component and thus the resolution of the first ADC 106-1 needs to be relatively high to faithfully reproduce the changes in switching voltage. The requirement for a large dynamic range with a relatively high resolution can be challenging to implement and may require the use of an ADC which takes up a relatively large amount of circuit area and/or which consumes a relatively large amount of power in use. Similarly the second ADC 106-2 monitors the switching voltage VN which, in this example, is a voltage of the same magnitude but opposite polarity and thus similar challenges exist for the second ADC 106-2.

Embodiments of the present disclosure provide for monitoring of the switching voltages in way that allows variations in the switching voltages to be identified and/or compensated, which mitigate at least some of the above-mentioned issues.

FIG. 2 illustrates one example of a switching driver 200 according to an embodiment in which similar components are identified by the same reference numerals.

The switching driver 200 of FIG. 2 is arranged for driving a load 101 with an output signal Sout based on an input signal Sin and like the example of FIG. 1 is arranged to drive the load 101 in a single-ended configuration. However, embodiments also relate to switching drivers that drive a load in a BTL configuration. The load 101 may, as discussed above, be any load that is driven with a variable output signal Sout based on an input signal, and may in particular be a transducer, such as an audio or haptic output transducer.

The switching driver 200 has an output bridge stage 102 with first and second switches 103-1 and 103-2 for selectively connecting the output node 104 to switching voltage VP and VN respectively, and a modulator 205 for controlling the duty-cycle of the switches 103-1 and 103-2 of the output stage 102 based on the input signal Sin.

In the switching driver 200, first and second ADCs 201 and 202 are provided for monitoring voltages based on the switching voltages VP and VN, however the first ADC 201 is configured to receive a voltage which is the sum of the switching voltages VP and VN. A combiner 203 is thus configured to sum the switching voltages VP and VN to provide a voltage VCM which is related to the common-mode voltage of the switching voltages, and which will be referred to herein as the common-mode voltage. The first ADC 201 receives this common-mode voltage VCM. The second ADC 202 is configured to receive a voltage which is the difference between the switching voltages VP and VN. A combiner 204 is thus configured to generate a voltage as a difference between the switching voltages VP and VN to provide a voltage VDIFF which is the differential voltage of the switching voltages. The second ADC 202 receives this differential voltage VDIFF.

In the situation where the switching voltages VP and VN are nominally equal and opposite, i.e. VN=−VP, the common-mode voltage VCM should, in the absence of any noise or other variation of the switching voltages, be zero. The common-mode voltage VCM will thus be a small signal that tracks any noise or offset in the switching voltages VP and VN. The first ADC 201 can thus be optimised for small signals and can be implemented with a relatively small dynamic range but high resolution.

The second ADC 202 receives the differential voltage VDIFF, which, in the absence of any noise will be a voltage which is double the magnitude of the switching voltages VP and VN. This can therefore be a relatively large voltage and the second ADC 202 may thus be optimized for larger signals. The noise signal component will still be a relatively small signal component, although the noise component of interest in this differential voltage will be a differential noise component, and as noted above it can in some cases be challenging to implement an ADC with a large dynamic range and also a relatively high resolution. However, for the switching driver 200 it is only the second ADC 202 which needs to have a large dynamic range. Thus, the first ADC 201 can be configured to have a dynamic range which is lower than that of the second ADC 202. In addition, as the first ADC 201, which monitors the common-mode voltage VCM, can be implemented to be optimized for smaller input signals, and can thus provide a good quality representation of the common-mode component of the noise of the switching voltages, in some cases, this could relax the resolution requirements for the second ADC 202 to achieve an overall performance level.

The outputs from the first and second ADCs 201 and 202, are first and second monitor signals indicative of the common-mode and differential components of the switching voltages VP and VN respectively. These signals are supplied to the modulator 205 which applies compensation to compensate for any variation of the switching voltage from their defined nominal values, as will be discussed in more detail below.

In some cases, the outputs of the first and second ADCs 201 and 202 may be filtered by respective filters 206 and 207, which may for instance be low-pass filters, to provide the first and second monitor signals. Such filters may be configured to remove any signal component due to the operation of the switching driver 200 at the PWM switching frequency which could appear in common-mode voltage VCM and differential voltage VDIFF and which, in some cases, could adversely impact on the compensation applied. In some cases, however, in particular if the first and seconds ADCs 201 and 202 are designed with a low-pass transfer function, the filters 206 and 207 may not be required. As noted above, these first and second monitor signals can be used to apply compensation to the input signal for noise affecting the switching voltages VP and VN.

As discussed above, the output node 104 is connected to the switching voltage VP for part of the switching cycle and connected to the voltage VN for the rest of the switching cycle, with the duty-cycle being controlled by the input signal.

The output voltage at the node 104 (over the course of a switching cycle) can thus be represented as:

$$Sout = \frac{1 + Sin}{2} VP + \frac{1 - Sin}{2} VN \qquad \text{Eqn. (1)}$$

where Sin is the level of the input signal normalised in a range from +1 to −1.

Where the switching voltages VP and VN are equal and opposite, they can be represented in terms of a defined nominal voltage magnitude Vnom modified by respective noise terms Vnp and Vnn, i.e. such that:

$$VP = Vnom + Vnp, \qquad \text{Eqn. (2)}$$
$$VN = -Vnom + Vnn$$

Thus, from equations 1 and 2 the output voltage at node 104, in the presence of noise on the switching voltage is:

$$Sout = \frac{1 + \text{Sin}}{2}(Vnom + Vnp) + \frac{1 - \text{Sin}}{2}(Vnom + Vnn) \qquad \text{Eqn. (3)}$$

which can be rearranged as:

$$Sout = \text{Sin} \cdot Vnom + \left(\frac{Vnp + Vnn}{2}\right) + \frac{\text{Sin}}{2}(Vnp - Vnn) \qquad \text{Eqn. (4)}$$

where the first term, Sin*Vnom is the desired output signal given the input signal and the following two terms are unwanted noise terms.

From equation 2 it can be seen that the common-mode voltage VCM and differential voltage VDIFF can be given as:

$$VCM = Vnp + Vnn, \qquad \text{Eqn. (5)}$$

$$VDIFF = 2Vnom + Vpn - Vnn$$

Equation 4 can thus be rewritten in terms of the common-mode voltage VCM and differential voltage VDIFF as:

$$Sout = \text{Sin} \cdot Vnom + \left(\frac{VCM}{2}\right) + \frac{\text{Sin}}{2}(VDIFF - 2Vnom) \qquad \text{Eqn. (6)}$$

which leads to:

$$Sout = \left(\frac{VCM}{2}\right) + \frac{\text{Sin}}{2}VDIFF \qquad \text{Eqn. (7)}$$

The modulator may be configured to generate a modified signal S1 such that the output signal Sout, based on the modified signal S1 in the presence of the actual noise, corresponds to an output signal that would be expected for the input signal Sin without modification if the first and second switching voltages had values equal to the defined nominal values i.e. so that Sout, based on using the modified signal S1 is equal to the desired output Sin*Vnom. Putting this into equation 6 gives:

$$\text{Sin} \cdot Vnom = \left(\frac{VCM}{2}\right) + \frac{S1}{2}VDIFF \qquad \text{Eqn. (8)}$$

which can be rearranged to give:

$$S1 = \frac{2Vnom \cdot \text{Sin} - VCM}{VDIFF} \qquad \text{Eqn. (9)}$$

where the factor 2*Vnom is a constant based on the known defined nominal voltage magnitude for the switching voltages VP and VN and VCM and VDIFF are monitored by the first and second ADCs 201 and 202 respectively.

Thus, for a given input signal Sin, a compensator can determine a modified input signal S1 that can be used to control the duty-cycle of the switches of the output bridge stage, and which compensates for any unwanted variation of the switching voltages VP and VN.

Figure 3:
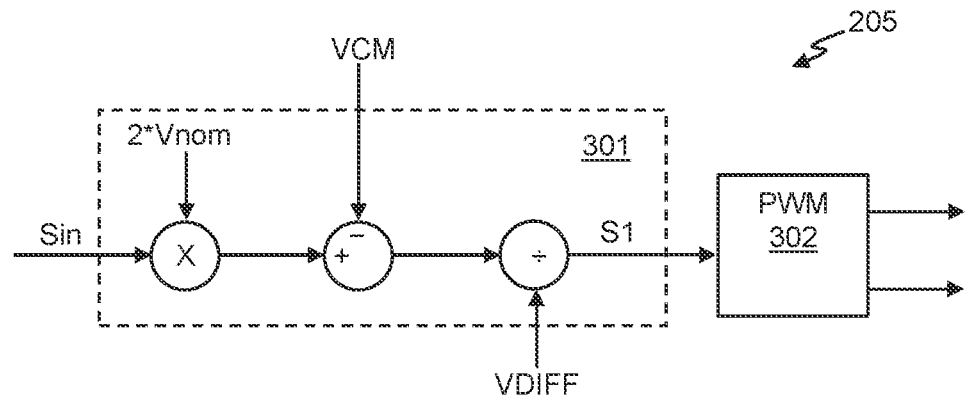
FIG. 3 illustrates an example of a compensator for compensating for a variation in switching voltages.

FIG. 3 illustrates one example of a suitable compensator 301, which could be implemented as part of the modulator 205. The compensator 301 receives the input signal Sin and multiplies it by the value 2*Vnom which may be stored in a suitable memory or the like (not separately illustrated). The value of the common-mode voltage VCM received from the first ADC 201 is then subtracted from this value and the result is divided by the value of the differential voltage VDIFF received from the second ADC 202. The resultant modified signal may then be input to a PWM modulator 302 or the like to determine suitable control signals for controlling the switches 103-1 and 103-2 of the output stage 102 with an appropriate duty-cycle.

The compensator 301 illustrated in FIG. 3 implements a divide operation. As will be understood by one skilled in the art, a divide operation can be a relatively computational complex operation to perform. In some embodiments, therefore, the compensator 301 may be arranged to apply a function that approximates the required division, e.g. by using a suitable approximation polynomial to determine a suitable inverse value. For example, for a small value of y, the inverse 1/y can be approximated by any of the following polynomials of increasing order: (i) 2−y, (ii) 3−3y+y², (iii) 4−6y+4y²−y³ and so on, with generally increasing accuracy. One of these polynomials can thus be used to provide an approximation for the inverse of the relevant divisor. For larger values of y, other inverse approximations can be used, such as Chebyshev polynomials as would be understood by one skilled in the art. The compensator 301 could therefore be configured to determine, without requiring a divide operation, an approximation to the inverse to the value of VDIFF, which can then be applied to the relevant signal path by multiplication. Alternatively, various inverse values for different expected values of VDIFF could be predetermined and stored. In use, the measured value of VDIFF could be used to select the most appropriate inverse value, e.g. from a look-up table or the like.

The compensator 301 could be implemented, at least partly, by dedicated hardware blocks such as digital multipliers, digital subtraction blocks and divide block and/or may be at least partly implemented by one or more suitable processors, as would be understood by one skilled in the art. The compensator 301 has been described as being part of the modulator 205 for ease but is illustrated as being separate to the PWM modulator 302 and it will be understood such a compensator could be implemented as part of a separate functional block. In some embodiments, however, a compensator could be implemented to apply compensation within the PWM modulator itself, e.g. within the control loop for the PWM modulator. As will be understood by one skilled in the art, the PWM modulator 302 will generally be operated with a feedback loop and may, for instance, comprise a delta-sigma modulator or the like. In some embodiments the compensation may be employed within the feedback loop, e.g. within a delta-sigma modulator control loop.

Figure 4:
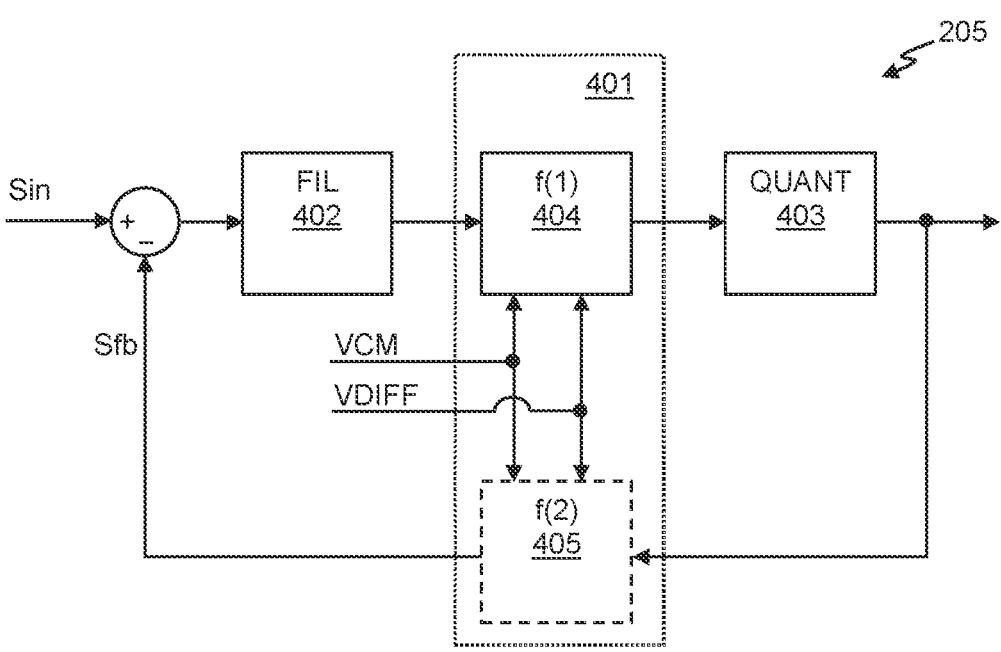
FIG. 4 illustrates another example of a compensator.

FIG. 4 illustrates one example of a modulator 205 that includes a compensator 401 for applying the compensation within the control loop of the modulator 205. FIG. 4 illustrates the modulator may be implemented as a delta-sigma type modulator. The input signal Sin is combined with a feedback signal Sfb and input to a filter 402 which may, for example, be an integrator to provide delta-sigma noise shaping. The output of filter 402 is input to a quantizer 403. The compensator 401 of FIG. 4 may comprise a block 404 for applying a function f(1) to the forward signal path within the control loop of the modulator 105, where the function f(1) may be based on the correction function of equation (9).

In some implementations, some compensation may additionally or alternatively be applied to the feedback path, by block 405 for applying a function f(2). For instance, applying a multiplication to the signal in the feedback path can have the same effect applying an equivalent divide in the forward signal path thus block 405 applying a multiplication based on VDIFF to the feedback signal can avoid the need for a division in the forward signal path. In general the functions f1(1) and/or f(2) are designed to compensate for the variation in supply voltage using the first and second monitor signals VCM and VDIFF. In this example compensation applied by block 404 is applied between filter 402 and quantizer 403, but in some embodiments at least some compensation could additionally or alternatively be applied to the forward signal path within the filter 402, in particular where the filter is a second or higher order filter.

It will of course be understood that other designs of modulator could be implemented, and the compensation functions applied may depend on where the compensation is applied and the design of the switching driver.

In general therefore a compensator is configured to apply compensation so as to compensate the output signal for unwanted variations in the switching voltages VP and VN. The particular form of compensation applied may be determined for a given application, i.e. based on the nominal values of the switching voltages and the point(s) in the signal path(s) that the compensation is applied. In some cases, the compensation applied may also comprise one or more calibration terms that take account of any variability in the values of certain parameters of the components from ideal or design values, for instance to take account of any variability in the switch resistances of the switches 103-1 and 103-2, any other variability in the impedances associated with the paths for supplying the switching voltages and/or any gain or variation in gain of the first and second ADCs 201 and 202 or in the combiners 203 and 204. The relevant component parameters could, in some cases, be determined as part of a calibration process during manufacturing and testing, e.g. as part of a factory calibration step, with appropriate calibration terms being stored for the compensator 301 or 401 to apply.

The embodiments above have been described in the context of switching voltages VP and VN which are equal and opposite and which do not vary in use. In some embodiments the switching voltages VP and VN may be variable in use, for instance the voltages could be varied in different operating modes or when required to provide signal peaks. For instance, for output signals in a first, lower range of magnitudes the switching voltages VP and VN could be equal and opposite and have a nominal value equal to a first magnitude. For output signals in a second, higher, range of magnitudes, and/or when operating in a higher power mode of operation, the magnitude of the switching voltages VP and VN could be increased to have a nominal value equal to a second, higher magnitude. In this case, the second ADC 202 may be configured to have a dynamic range sufficient for the differential signal that will result for the highest magnitude switching voltages and the compensator 301 or 401 may be configured to generate the modified signal using a value that corresponds to the appropriate nominal value of the magnitude of the switching voltages that are presently being used.

It is also possible to apply the principles of this disclosure to embodiments where the switching voltages are, in at least one mode of operation, not equal and opposite, for example where the switching voltages are a non-zero supply voltage and ground. In general, it is possible to represent the output voltage, including the effect of noise at the switching terminals, in terms of the common-mode and differential components of the switching voltages and to derive, based on the known nominal values of the switching voltages, a suitable correction signal based on the common-mode and differential components. However, if the switching voltages are not substantially equal and opposite, the benefits of the common-mode voltage being a small voltage which can be monitored with an ADC optimized for small signals may not apply. Embodiments may, therefore, be preferably applied where the switching voltages are equal and opposite in at least one mode of operation.

In general, therefore, embodiments relate to switching drivers with an output stage for switching an output node between first and second switching voltages in which a compensator is configured to compensate for variations in the first and second voltages based on an indication of a common-mode voltage of a sum of the first and second switching voltages and an indication of a differential voltage of a difference between the first and second switching voltages and/or a first ADC is configured to receive a voltage which is a sum of the first and second switching voltages and to output a first monitor signal and a second ADC is configured to receive a voltage which is a difference of the first and second switching voltages and to output a second monitor signal; and a modulator is configured to control a duty cycle of switches based of the output stage based on the input signal, the first monitor signal and the second monitor signal.

The embodiments above have been discussed in the context of a single-ended driver for driving one side of a load with a varying drive signal based on the input signal, whilst the other side of the load being held at a fixed DC voltage. Embodiments may, however, be implemented for driving a load in a bridge-tied-load (BTL) configuration, where both sides of the load are driven with a varying drive signal based on the input signal. In such an implementation, if both sides of the load are switched between the same switching voltages VP and VN, a modulator may be configured to generate appropriate switch control signals to control the duty-cycles on both sides of the load appropriately based on the input signal. In such a case, the first and second ADCs 201 and 202 may generate an indication of the common-mode voltage VCM and differential voltage VDIFF that can be used to determined appropriate compensation to applied in the modulator in a similar manner as discussed above, but taking into account the respective duty-cycles on both sides of the load or compensation could be applied so as to effective correct the duty-cycle on each side of the load separately, possibly taking suitable calibration factors into account.

It will be noted that in some applications a device may comprise multiple different switching drivers configured for driving separate loads in separate channels, for instance in an audio application there could be at least two audio channels for multichannel audio, such as stereo, and each audio channel may comprise a respective switching driver. At least some of the switching drivers for the different channels may share supply rails for the switching voltages, in which case each of the switching drivers may be implemented according to embodiments of the present disclosure, but the first and second ADCs could be shared between the different channels, in others words the first and second ADCs could provide the first and second monitor signals of the common-mode and differential voltages of the supply rails for compensation separately in each channel. In this case there may be specific calibration terms for each channel to take account of any variations for the relevant channel, e.g. variation in impedance in paths to the switching driver of the channel or any variation of the components of the relevant switching driver.

The examples above have been discussed in the context of driving a transducer, which may in particular be an audio transducer, and embodiments of the present disclosure may advantageously be used in audio application or other applications for driving a transducer, e.g. such as haptic output transducer.

Embodiments of the switching driver may be implemented as an integrated circuit, although at least some components, may be external, off-chip components. Embodiments may be implemented in a host device, especially a portable and/or battery powered host device such as a mobile computing device for example a laptop, notebook or tablet computer, or a mobile communication device such as a mobile telephone, for example a smartphone. The device could be a wearable device such as a smartwatch. The host device could be a games console, a remote-control device, a home automation controller or a domestic appliance, a toy, a machine such as a robot, an audio player, a video player. It will be understood that embodiments may be implemented as part of a system provided in a home appliance or in a vehicle or interactive display. There is further provided a host device incorporating the above-described embodiments.

The skilled person will recognise that some aspects of the above-described apparatus and methods, for instance for determining the modified signal, may be provided by suitable machine readable instruction stored, for example, on a non-volatile carrier medium such as a disk, CD- or DVD-ROM, programmed memory such as read only memory (Firmware), or on a data carrier such as an optical or electrical signal carrier. For some applications, embodiments may be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A switching driver for driving a load with an output drive signal based on an input signal comprising:

first and second switches for selectively connecting a first output node to first and second switching voltages respectively to generate a first output voltage at said output node;

a compensator configured to receive a first monitor signal indicative of a sum of the first and second switching voltages and a second monitor signal indicative of a difference between the first and second switching voltages and to apply compensation to the input signal based on the first and second monitor signals so as to compensate for variations in the first and second switching voltages from defined nominal values of the first and second switching voltages;

a modulator configured to control a duty cycle of the first and second switches based on the input signal after said compensation has been applied.

2. The switching driver of claim 1 wherein the defined nominal values of the first and second switching voltages are equal and opposite.

3. The switching driver of claim 1 wherein, in one mode of operation, the defined nominal value of the first switching voltage is non-zero and positive and the defined nominal value of the second switching voltage is ground.

4. The switching driver of claim 1 comprising:

a first analog-to-digital converter configured to receive a voltage which is a sum of the first and second switching voltages and to output said first monitor signal; and a second analog-to-digital converter configured to receive a voltage which is a difference of the first and second switching voltages and to output said second monitor signal.

5. The switching driver of claim 4 wherein the first analog-to-digital converter has a dynamic range which is lower than the second analog-to-digital converter.

6. The switching driver of claim 4 wherein the first analog-to-digital converter is optimized for smaller input signals than the second analog-to-digital converter.

7. The switching driver of claim 4 comprising first and second filters configured to apply low-pass filtering to the first and second monitor signals respectively.

8. The switching driver of claim 1 wherein the compensator is configured to apply said compensation to the input signal by generating a modified input signal based on the input signal, the first monitor signal and the second monitor signal and the modulator is configured to control the duty cycle of the first and second switches based on the modified input signal.

9. The switching driver of claim 8 wherein the compensator is configured to generate the modified input signal based on the first and second monitor signals, such that the first output voltage corresponds to an output voltage that would be expected for the input signal without modification if the first and second switching voltages had values equal to the defined nominal values of the first and second switching voltages.

10. The switching driver of claim 8 wherein the compensator is configured to generate the modified input signal based on the function $(2*V_{nom}*Sin-VCM)/VDIFF$ where Sin is the input signal $V_{nom}$ is the nominal defined magnitude of the first and second switching voltages, VCM is the value of the first signal and VDIFF is the value of the second signal.

11. The switching driver of claim 1 wherein the modulator comprises a forward signal path and a feedback path forming a control loop and the compensator is configured to apply said compensation to the input signal by applying to a compensation function to at least one of the forward signal path and the feedback path of the modulator.

12. The switching driver of claim 1 further comprising third and fourth switches for selectively connecting a second output node to said first and second switching voltages respectively to generate a second output voltage at said second output node, so as to drive a load connected, in use, between the first and second output nodes with said output drive signal and wherein the modulator is also configured to control a duty cycle of the third and fourth switches based on the input signal after said compensation has been applied.

13. The switching driver of claim 1 configured as an audio driver for driving an audio output transducer.

14. The switching driver of claim 1 implemented as an integrated circuit.

15. An electronic device comprising the switching driver of claim 1.

16. A switching driver for driving a load based on an input signal comprising:

an output stage for selectively connecting an output node to first and second switching voltages respectively; and a modulator configured to control a duty cycle of the output stage based on the input signal;

wherein the modulator comprises a compensator configured to compensate for variations in the first and second voltages based on an indication of a sum of the first and second switching voltages and an indication of a difference between the first and second switching voltages.

17. A switching driver for driving a load with an output drive signal based on an input signal comprising:

an output bridge stage comprising first and second switches for selectively connecting an output node to first and second switching voltages respectively to generate said output drive signal at said output node;

a first analog-to-digital converter configured to receive a voltage which is a sum of the first and second switching voltages and to output a first monitor signal;

a second analog-to-digital converter configured to receive a voltage which is a difference of the first and second switching voltages and to output a second monitor signal; and a modulator configured to control a duty cycle of the first and second switches based on the input signal, the first monitor signal and the second monitor signal.

*    *    *    *    *